June 3, 1969 R. E. HALL 3,448,275

ELECTRO-OPTICAL SCANNER WITH A PHOTOCELL AND A BLOCKING DIODE IN SERIES

Filed June 7, 1967 Sheet 1 of 2

VI CHARACTERISTIC OF ONE DIODE PAIR

TOTAL SCANISTOR CURRENT

INVENTOR
RICHARD E. HALL

BY Sughrue, Rothwell, Mion, Zinn & Macpeak

ATTORNEYS

United States Patent Office 3,448,275

Patented June 3, 1969

3,448,275

ELECTRO-OPTICAL SCANNER WITH A PHOTO-CELL AND A BLOCKING DIODE IN SERIES

Richard E. Hall, Rochester, Minn., assignor to International Business Machines Corporation, Armonk, N.Y., a corporation of New York Filed June 7, 1967, Ser. No. 644,178
Int. Cl. H01j *39/12*
U.S. Cl. 250—209 8 Claims

ABSTRACT OF THE DISCLOSURE

An electro-optical scanner scans a light intensity pattern. The light pattern is directed upon a plurality of spaced photodiodes which are non-conducting when dark and conducting when light falls upon them. The outputs of the photodiodes are connected in common to a summing amplifier circuit. A plurality of normally non-conducting blocking diodes are each connected to a different one of the photodiodes. The blocking diodes are each connected to a different point on a voltage divider. A positive ramp voltage is applied to one end of the divider and a negative ramp voltage, in-phase with the positive ramp voltage, is applied to the other end of the divider. The common node of each blocking diode and photodiode is connected through a capacitor to a common point which is connected to the input of an operational amplifier having a resistive feedback path. The two ramp voltages combine to form a voltage null which sweeps from one end of the voltage divider to the other. Each time the null occurs at a point to which a blocking diode is connected, that diode becomes conducting through its associated capacitor to cause an increase in current flowing to the common point. The operational amplifier and capacitors function to differentiate the total current signal and produce a staircase voltage waveform wherein each step corresponds in time to the switching of a corresponding diode to its conducting state. These steps are then differentiated to provide a synchronizing pulse each time the null point occurs at a blocking diode whether or not the associated photodiode is conducting. If a photodiode is lighted when the null point sweeps past its associated blocking diode, a current path is completed to increase the level of current at the input of the summing amplifier. Each increase or step of photodiode current is also differentiated to provide a data pulse which corresponds in time with the sync pulse. If a photodiode is dark when the null point sweeps past its associated blocking diode, then no data pulse is produced even though the synchronizing pulse is produced.

BACKGROUND OF THE INVENTION

*Field of the invention*

This invention pertains to the art of electro-optical scanners which translate a spatially dependent light pattern into a corresponding time dependent electrical signal.

*Description of the prior art*

Electro-optical scanners of the type employing a scanning ramp voltage are generally known in the prior art. Such prior art devices accurately translate the spatial light intensity pattern into a time dependent electrical signal only if a linear relationship exists between the time at which voltage changes occur at the outputs of the photodiodes and the time at which the blocking diodes are switched by the scanning ramp voltage. In practice such a linear relationship does not exist for the following reasons: (a) the resistance of the divider between blocking diode pairs may be different from diode pair to diode pair; (b) the ramp voltage itself may not be linear; (c) most importantly, in a practical scanner the current through the photodiodes is significant enough to alter the potentials appearing at the various points of the voltage divider to which the blocking diodes are connected. Since the photodiode currents are a function of the light intensity pattern being scanned, the voltage at any given point on the voltage divider will vary in an unknown manner. Accurate timing cannot be obtained in such prior art devices by counting the times the blocking diodes switch since the series connected photodiodes may be dark in which case no detectable current flows.

SUMMARY

The present invention overcomes the problem of inherent non-uniformity in the signal in such electro-optical scanners by providing a separate circuit which produces a synchronizing signal each time a blocking diode switches whether or not its associated photodiode is exposed to light. A separate data pulse is provided only upon the coincidence of switching of the blocking diode and light falling upon the photodiode. If a blocking diode switches in the absence of light impinging upon its associated photodiode, then only a synchronizing pulse is provided. The synchronizing pulses can then be counted in order to relate the time dependent data pulses to the space dependent optical pattern being sensed.

DESCRIPTION OF A PREFERRED EMBODIMENT

Figure 1:
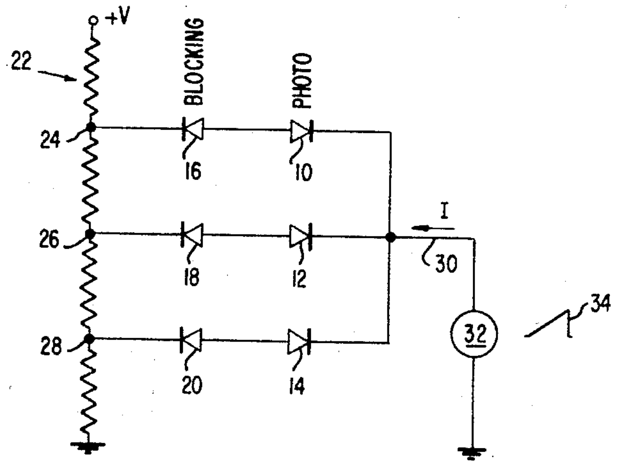
FIG. 1 PRIOR ART
FIGURE 1 is a schematic circuit diagram of a prior art electro-optical scanner.

FIGURE 1 is a schematic diagram of a prior art electro-optical scanner 9. A plurality of photodiodes 10, 12 and 14 are each connected in series with one of a plurality of blocking semiconductor diodes 16, 18 and 20. The photodiodes are spaced in a desired manner to receive light from an optical pattern which varies spatially in light intensity. More specifically, each photodiode is normally non-conducting in the reverse direction, but substantial reverse leakage current flows when it is exposed to light. The leakage current increases as the intensity of the light increases.

Figure 2:
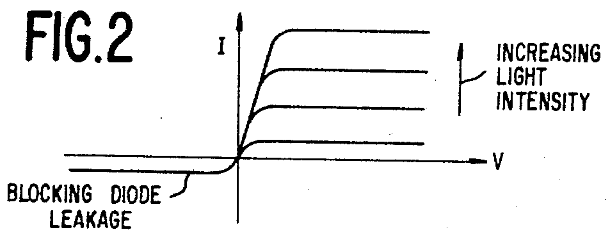
FIGURE 2 is a plot of a photodiode's reverse leakage current vs. the voltage across a series circuit of a photodiode and a forward biased blocking diode for different values of light intensity impinging upon the photodiode.

FIGURE 2 illustrates the leakage current characteristic of each pair of blocking and photodiodes. The curves show that when the voltage across the pair of diodes is negative to back bias the blocking diode, a slight leakage current 21 flows in the reverse direction through the blocking diode and in the forward through the photodiode. When the photodiode in a pair is exposed to light and the voltage across the pair is such as to forward bias the blocking diode, then photodiode leakage current flows in the reverse direction through the photodiode and in the forward direction through the blocking diode, the amount of current increasing as the light intensity increases as shown by the family of curves 23 in FIGURE 2.

A voltage divider 22 is connected between a source of positive voltage +V and ground. The cathodes of the three blocking diodes are connected to corresponding points 24, 26 and 28 on the voltage divider so that the voltage divider is divided into four sections of equal resistance. The voltage divider back biases the three blocking diodes 16, 18 and 20. The voltages at points 20, 26 and 24 are designated $V_1$, $V_2$ and $V_3$ respectively, where $V_1 < V_2 < V_3$.

The cathodes of the three photodiodes are connected to a common conductor 30. A positive ramp voltage generator 32 is connected between ground and conductor 30 and applies a voltage having the waveform 34 across the three diode pairs in opposition to the voltages appearing at each of the points 24, 26 and 28. As the ramp voltage increases from zero to maximum amplitude with time, the back biasing voltages $V_1$, $V_2$ and $V_3$ are overcome in that sequence to render the blocking diodes 20, 18 and 16 conducting in succession.

Figure 3:
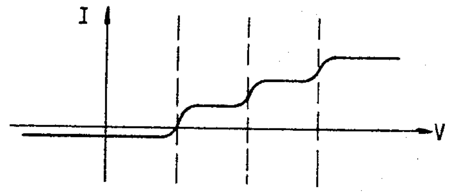
FIGURE 3 is a plot of the total current flowing through all of the blocking diode-photodiode pairs illustrated in FIGURE 1 assuming all photodiodes are exposed to the same light intensity.

If a photodiode is exposed to light when its associated blocking diode becomes forward biased, current flows from the common conductor 30 through the diode pair and through the voltage divider 22 to ground. The current in common conductor 30 will increase its level every time one of the diode pairs becomes conducting. The leakage current is dependent on the light intensity but is substantially independent of the voltage across the diode pair. FIGURE 3 illustrates the resulting stepped waveform of the current in conductor 30 if all of the photodiodes 14, 12 and 10 are exposed to light and conducting as the three blocking diodes 20, 18 and 16 are scanned. Even though only three diode pairs are shown, it is understood that as many as desirable may be used in order to sense a particular optical pattern.

Figure 4:
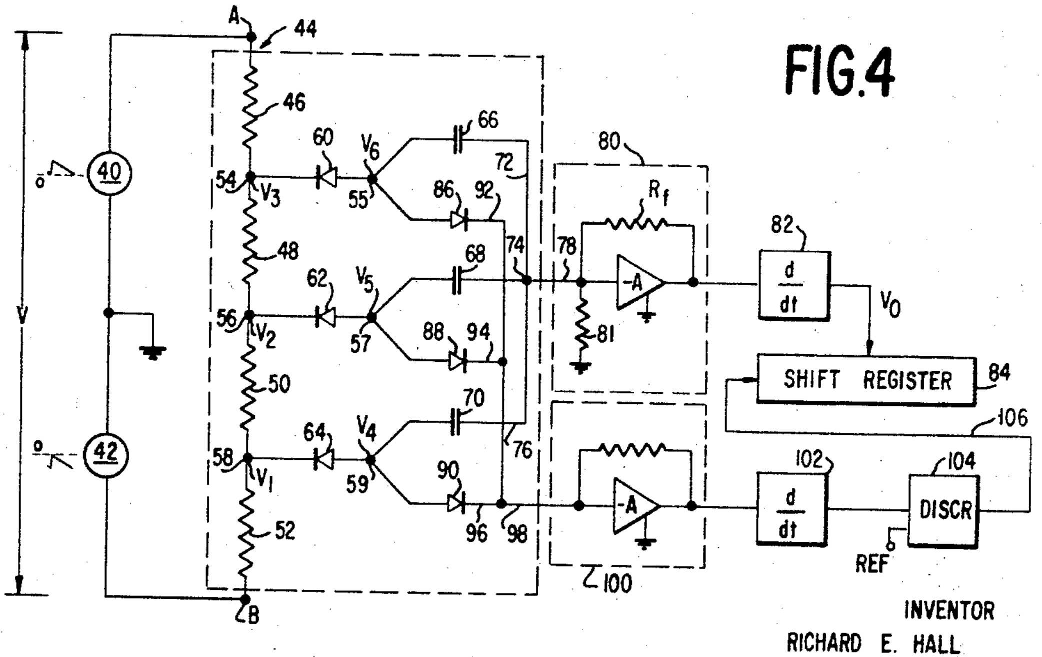
FIGURE 4 is a schematic circuit diagram of the preferred embodiment of the invention wherein a synchronizing pulse is produced each time a blocking diode is scanned.

FIGURE 4 is a schematic diagram of the preferred embodiment of the invention which is an improvement of the scanner illustrated in FIGURE 1. In the preferred embodiment, a pair of ramp voltage generators 40 and 42 drive the opposite ends of a voltage divider 44 which consists of four equal resistors 46, 48, 50 and 52. One side of each of the ramp voltage generators is connected to ground and the voltage across the divider 44 is designated V. The voltage from the positive ramp voltage generator 40 appears at the top of voltage divider 44 at point A and is illustrated by waveform $V_A$ in FIGURE 5. The output of the ungrounded side of the negative ramp voltage generator 42 appears at the bottom of voltage divider 44 at point B and is designated as waveform $V_B$ in FIGURE 5. The three points separating the equal resistors of voltage divider 44 are designated 54, 56 and 58. Blocking diodes 60, 62 and 64 are each connected between a different one of these points and a corresponding one of a plurality of capacitors 66, 68 and 70. Conductors 72, 74 and 76 connect the capacitors 66, 68 and 70, respectively, to a common sync conductor 78.

Common conductor 78 is connected to the input of a resistance feedback operational amplifier 80 whose output is connected to a differentiating circuit 82 whose output in turn is connected to the shift bus of a shift register 84. A resistor 81 is connected to the input of amplifier 80 to minimize drift. Connected between each of the junction points 55, 57 and 59 of blocking diodes 60, 62 and 64 and capacitors 66, 68 or 70 is a different one of three photodiodes 86, 88 and 90. The anode of each photodiode is connected to the anode of its corresponding blocking diode and the cathodes of the three photodiodes are connected through corresponding conductors 92, 94 and 96 to a common data conductor 98. Conductor 98 is connected to the input of a summing operational amplifier 100 whose output is fed through a differentiator 102 and a voltage discriminator 104 to the input bus 106 of shift register 84.

In operation, the ramp voltages $V_A$ and $V_B$ combine to from a time varying null point of ground or zero potential which travels from point B of the voltage divider to point A during each period of the voltage generator 40 and 42. At time $t_1$ in FIGURE 5, $V_B$ is zero and $V_A$ is at its maximum value. At this time, a positive voltage appears at each of the points 54, 56 and 58 so that all of the blocking diodes 60, 62 and 64 are back biased and therefore non-conducting in the forward direction. Voltages $V_A$ and $V_B$ are of opposite polarity, but are in-phase with each other. Consequently, as $V_A$ begins to decrease toward zero or ground, $V_B$ goes from zero towards its maximum negative value.

At time $t_2$ when $V_A$ equals three times $V_B$, the resultant voltage $V_1$ at point 58 is zero and blocking diode 64 becomes forward biased from that time to the beginning of the next ramp at time $t_0$. Similarly, at time $t_3$ when $V_A$ equals $V_B$, the voltage $V_2$ at point 56 is at ground potential and blocking diode 62 becomes forward biased and remains so until the end of the cycle. At time $t_4$ when $V_A$ equals ⅓ $V_B$, the voltage $V_3$ at point 54 becomes zero to forward bias blocking diode 60.

Each of the voltages $V_1$, $V_2$, $V_3$ becomes zero then continues to become increasingly negative so that each diode remains forward biased from the time its cathode becomes zero to the end of the ramp voltage cycle. The voltage waveform $V_5$ at point 57 is illustrated in FIGURE 4. Once the blocking diode 62 becomes forward biased at time $t_2$, the voltage $V_5$ follows the voltage $V_2$ as capacitor 68 charges to a negative potential from time $t_3$ to time $t_0$. Note from the waveform $V_5$ that the anode voltage of each blocking diode is at ground or zero potential whenever its associated point on the voltage divider is zero, but then is negative from that point until the end of the cycle. Consequently, as the ramp voltages $V_A$ and $V_B$ vary from $t_1$ to $t_0$, the blocking diodes 64, 62 and 60 become successively conducting in that sequence.

Figure 5:
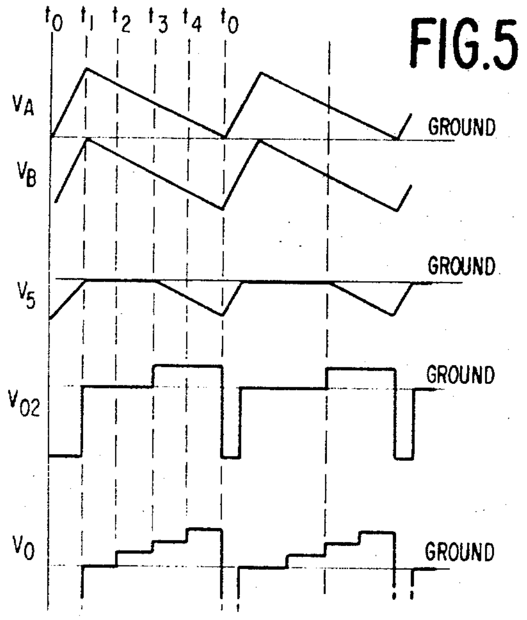
FIGURE 5 is a diagram of waveforms appearing at various points in the circuit of FIGURE 4.

Operational amplifier together with the capacitors 66, 68 and 70 function as a differentiator which differentiates and inverts the current appearing on the common conductor 78. Since the voltage appearing across each capacitor when its associated blocking diode becomes forward biased is a negative ramp voltage, the current through each capacitor is a constant. Each time the current in conductor 78 increases because of the switching of another blocking diode, the output of operational amplifier 80 increases suddenly to a new level. The contribution to the output voltage $V_0$ of operational amplifier 80 from blocking diode 62 is designated $V_{02}$ in FIGURE 5. The output voltage of operational amplifier for one complete sweep of the ramp voltage is a staircase waveform $V_0$ as illustrated in FIGURE 5. The staircase waveform is applied to differentiator circuit 82 whose output is a series of synchronizing pulses corresponding to the beginning of each step of the waveform $V_0$. These synchronizing pulses are applied as shift pulses to the shift register 84.

If light is impinging upon a photodiode when its associated blocking diode becomes forward biased, then leakage current proportional to the intensity of the light will flow from the summing operational amplifier 100 through the photodiode in the reverse direction and through its associated blocking diode in the forward direction and through the voltage divider to ground. Operational amplifier 100 acts as a summing amplifier and inverter. The current flowing through each of the photodiodes 86, 88 and 90 is summed by the amplifier 100 whose output is a step voltage waveform which is differentiated by differentiator circuit 102 to produce data pulses. These data pulses are applied to a voltage discriminator circuit 104 which passes only those data pulses which exceed a predetermined reference voltage. The output of the discriminator is a series of output data pulses of a constant amplitude which are applied to the input bus of shift register 84.

Consequently, whenever a photodiode is illuminated at the time its associated blocking diode becomes forward biased, both a data pulse and a shift pulse are applied to shift register 14 to shift the contents of the shift register one stage and stored a "1" in the first stage of the shift register. If a photodiode is not illuminated when its associated blocking diode becomes forward biased, a shift pulse is supplied to shift register 84 but no data pulse is generated, and consequently the contents of the shift register are shifted one stage and a zero is set into the first stage of the shift register.

In the electro-optical transducer of FIGURE 4, each step in the output voltage waveform $V_0$ occurs when the voltage at the junction of an associated pair of photo and blocking diodes switches from a positive to a negative value as shown by the waveforms $V_5$ and $V_{02}$ for point 57 in FIGURE 5. This switching point is also the time at which the coupled photodiode becomes back biased to and permits the flow of a leakage current which is proportional to the intensity of the light impinging upon the photodiode. Correlation between the switching of the biases on the blocking and photodiodes is independent of the exact magnitudes of the voltage on the voltage divider at the point connected to the blocking diode or o the shape of the ramp voltage waveforms $V_A$ and $V_B$. The circuit in FIGURE 4 provides a means for positively detecting when each pair of blocking and photodiodes is active. Consequently, the ramp biasing voltage need not be perfectly linear with time and the semiconductor diodes need not have to have identical characteristics. The output synchronizing pulses positively identify each diode pair which is being read out.

Figure 6:
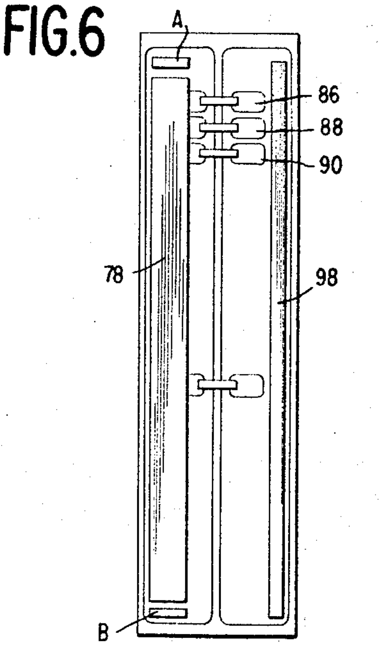
FIGURE 6 is a schematic plan view of an integrated circuit corresponding to a portion of the circuit diagram of FIGURE 5.
Figure 7:
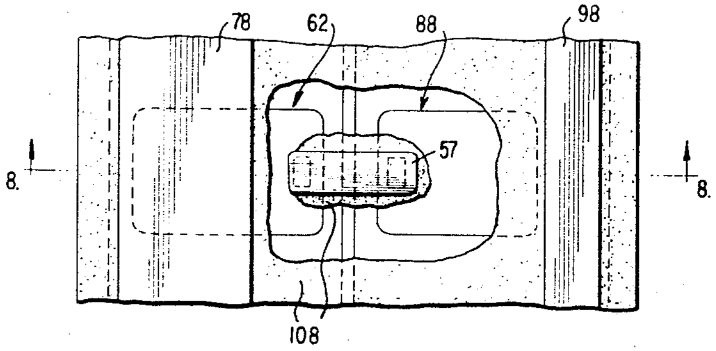
FIGURE 7 is an enlarged cut-away view of a portion of FIGURE 6.
Figure 8:
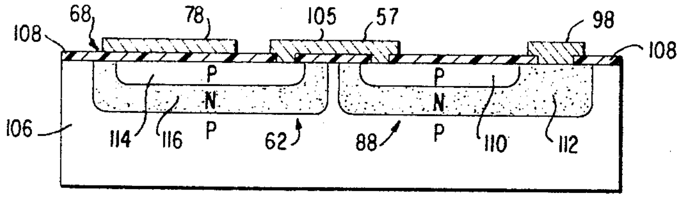
FIGURE 8 is a cross sectional view taken along line 8—8 of FIGURE 7.

An integrated circuit implementation of the electro-optical scanner 9 is illustrated schematically in FIGURES 6, 7 and 8, in which the reference numerals of FIGURE 4 have been used to indicated corresponding elements.

Common sync conductor 78, common data conductor 98 and a conductor 105 are aluminum layers plated on the surface of the semiconductor chip 106. Conductors 98 and 105 make contact with appropriate P and N areas through openings in an insulating coating 108. P area 110 and N layer 112 form the photodiode 88. P area 114 and N layer 116 form the blocking diode 62. Furthermore, the insulating coating 108 over the P area 114 functions as a dielectric to form the capacitor 68 with the sync conductor 78 and the P area 114 which is in contact with conductor 105 which in turn forms the junction point 57 between the blocking and photo diodes.

Let us now present some typical values of the components of the circuit illustrated in FIGURES 4 and 6–9. Capacitances on integrated circuits can be made with capacitive values of 0.5 to 2.5 pfd./mil². A typical photodiode dimension would be 0.004 inch x 0.010 inch. If it is assumed that the capacitor has the same dimension, then the capacitance is 20 pfd. The ramp voltage may be 20 volts and the period of the ramp 0.5 millisecond. Then $dV_2/dt=4\times10^4$ volts per second. Consequently, when $V_2$ is less than zero, $dV_5/dt=4\times10^4$ volt per second. When $V_2$ is greater than zero, $dV_5/dt=0$. The feedback resistance $R_f$ of the operational amplifier may be chosen as 1000 kilohms. It can then be calculated that the output voltage $$V_0=R_fC\frac{dV}{dt}$$

or 80 millivolts per step which is a very good signal.

While the invention has been particularly shown and described with reference to a preferred embodiment thereof, it will be understood by those skilled in the art that various changes in form and details may be made therein without departing from the spirit and scope of the invention.

What is claimed is:

1. An electro-optical scanner comprising:

(a) a plurality of light responsive devices which are adapted to be exposed to an optical pattern varying in light intensity, each device having an electrical characteristic which is dependent upon the intensity of the light to which it is exposed, (b) a plurality of electrical signal responsive means each associated with a different one of said light responsive devices and each responsive to a different value of a parameter of a signal to change an electrical characteristic of said means, (c) means for applying to said signal responsive (d) detecting means coupled to each of said signal responsive means for providing a synchronizing signal each time said parameter of said scanning signal matches the value thereof to which one of said signal responsive means is responsive, and (e) means coupled to said light responsive devices for producing an output signal each time a change in said electrical characteristic of a light responsive device coincides with the change in said electrical characteristic of its associated signal responsive means.

2. An electro-optical scanner as defined in claim 1 wherein said detecting means comprises a differentiator circuit.

3. An electro-optical scanner as defined in claim 2 wherein said differentiator circuit comprises (a) an operational amplifier, and (b) a plurality of capacitors each connected between the input of said amplifier and a different one of said signal responsive means.

4. An electro-optical scanner as defined in claim 1 wherein (a) said light responsive devices are photo-diodes which are normally non-conducting in one direction but which are rendered conducting when exposed to light and (b) said signal responsive means comprise:

(1) a plurality of normally non-conducting blocking diodes each coupled to a different one of said photo-diodes, (2) a voltage divider, (3) means connecting each of said blocking diodes to a different point on said voltage divider between the ends thereof, and wherein (c) said scanning signal is ramp voltage, whereby said blocking diodes are rendered sequentially conducting from one end of said voltage divider to the other during a cycle of said scanning signal.

5. An electro-optical scanner as defined in claim 4 wherein said detecting means comprises:

(a) a capacitor connected in series with each blocking diode, (b) an operational amplifier with a resistive feedback loop, and (c) means connecting each capacitor to the input of said operational amplifier.

6. An electro-optical scanner as defined in claim 5 further comprising:

(a) a second operational amplifier, and (b) means connecting each of said photo-diodes to the input of said second operational amplifier whereby a voltage signal appears on the output of said second operational amplifier whenever one of said blocking diodes becomes conducting when its associated photo-diode is exposed to light.

7. An electro-optical scanner as defined in claim 6 wherein said scanning signal applying means comprises:

(a) means for establishing a reference potential, (b) means for applying to one end of said voltage divider a first ramp voltage above said reference potential, and (c) means for applying to the other end of said voltage divider a second ramp voltage below said reference potential but in phase with said first ramp voltage.

8. A scanner comprising:

(a) a plurality of condition responsive devices each having an electrical characteristic which is dependent upon the value of a condition, (b) a plurality of electrical signal responsive elements each associated with a different one of said condition responsive devices and each responsive to a different value of a parameter of an electrical signal to change said electrical characteristic of said element, (c) means for applying to said signal responsive elements an electrical scanning signal having a parameter varying in time, (d) means coupled to said plurality of signal responsive elements for producing a synchronizing signal each time said parameter of said scanning signal matches the value thereof to which a signal responsive element is responsive, and (e) means coupled to said condition responsive devices for providing an output signal each time a change in said electrical characteristics of a condition responsive device coincides with a change in said electrical characteristics of its associated signal responsive element.

References Cited

UNITED STATES PATENTS

| | | | |
|---|---|---|---|
| 3,317,733 | 5/1967 | Hotron et al. | 250—211 |
| 3,319,080 | 5/1967 | Cornely et al. | |
| 3,344,278 | 9/1967 | Yanai | 250—211 |
| 3,351,768 | 11/1967 | Cooke | 250—209 X |

JAMES W. LAWRENCE, *Primary Examiner.*

C. R. CAMPBELL, *Assistant Examiner.*

U.S. Cl. X.R.

250—208, 211; 307—311

PO-1050
(5/69)

UNITED STATES PATENT OFFICE
CERTIFICATE OF CORRECTION

Patent No. 3,448,275 Dated June 3, 1969

Inventor(s) Richard E. Hall

It is certified that error appears in the above-identified patent and that said Letters Patent are hereby corrected as shown below:

IN THE SPECIFICATION

Column 5, line 7 - "stored" should be "store"
Column 5, line 27 - "of the shape" should be "to the shape"
Column 5, line 38 - "indicated" should be "indicate"

IN THE CLAIMS

Column 6, line 13 (c of Claim 1) insert after "responsive" ----means an electrical scanning signal in which said parameter varies in time.---

SIGNED AND SEALED

SEP 2 - 1969

(SEAL)
Attest:

Edward M. Fletcher, Jr.
Attesting Officer

WILLIAM E. SCHUYLER, JR.
Commissioner of Patents